United States Patent [19]

Majumdar

[11] Patent Number: 4,941,030
[45] Date of Patent: Jul. 10, 1990

[54] SEMICONDUCTOR DEVICE

[75] Inventor: Gourab Majumdar, Itami, Japan

[73] Assignee: Mitsubishi Denki Kabushiki Kaisha, Tokyo, Japan

[21] Appl. No.: 825,868

[22] Filed: Feb. 4, 1986

[30] Foreign Application Priority Data

Feb. 5, 1985 [JP]  Japan .................. 60-20474

[51] Int. Cl.⁵ .............. H01L 27/02; H01L 29/78; H01L 29/06
[52] U.S. Cl. .................. 357/43; 357/23.4; 357/34; 357/38; 357/41; 357/47; 357/55; 307/303; 307/318; 307/570; 307/589; 307/584
[58] Field of Search ............... 357/23.4, 55, 43, 38 T, 357/34, 41, 47; 307/303, 318, 570, 581, 584

[56] References Cited

U.S. PATENT DOCUMENTS

| | | | |
|---|---|---|---|
| 3,285,074 | 11/1966 | Elazar | 307/318 |
| 3,300,710 | 1/1967 | Knauss | 307/318 |
| 4,331,969 | 5/1982 | Baliga | 357/43 |
| 4,402,003 | 8/1983 | Blanchard | 357/43 |
| 4,441,117 | 4/1984 | Zommer | 357/43 |
| 4,546,367 | 10/1985 | Schutten et al. | 357/23.4 |
| 4,568,958 | 2/1986 | Baliga | 357/23.4 |
| 4,604,535 | 8/1986 | Sasayama et al. | 357/43 |
| 4,620,211 | 10/1986 | Baliga et al. | 357/23.4 |

FOREIGN PATENT DOCUMENTS

| | | | |
|---|---|---|---|
| 0055644 | 7/1982 | European Pat. Off. | 357/43 |
| 0097442 | 4/1984 | European Pat. Off. | 357/23 VD |
| 2110326 | 6/1972 | France | 357/43 |
| 2524711 | 7/1983 | France | 357/38 T |
| 55-133574 | 10/1980 | Japan | 357/23.4 |
| 59-167119 | 9/1984 | Japan | 357/43 |
| 1367325 | 9/1974 | United Kingdom . | |

OTHER PUBLICATIONS

Advanced Technology, Session XVIII, ISSCC 77, Feb. 18, 1977, Internat'l Solid State Circuits Conf., vol. 20, No. 20.

Die Schaltungstechnik von Leistungs-MOSFETS, Electronik Arbeitsblatt Nr. 161, vol. 32, (1983).

"A Comparison Between BIMOS Device Types", M. S. Adler, IEEE Power Electronics Specialists Conference, Jun. 1982, pp. 371–377.

Primary Examiner—6
Assistant Examiner—Ngan Van Ngo
Attorney, Agent, or Firm—Lowe, Price, Leblanc, Becker & Shur

[57] ABSTRACT

A semiconductor device in which, in a planar type bipolar transistor having a collector layer (22) in a substrate side, a base layer (23) formed on the collector layer (22) and an emitter island (24) formed in the base layer (23), a groove (25) is provided in the emitter island (24) to reach at least the interface between the base layer (23) and the collector layer (22) to form a conductive film (27) through a dielectric film (26) in the groove to be employed as a gate electrode of a MOS-FET thereby to implement a monolithic parallel Bi-MOS device, while the base electrode (28) of the bipolar transistor (40) and the gate electrode (29) of the MOS-FET (50) are connected with a help of diodes including a zener diode (10) thereby to implement a monolithic three-terminal parallel Bi-MOS switching device of small chip size.

8 Claims, 8 Drawing Sheets

SEMICONDUCTOR DEVICE

BACKGROUND OF THE INVENTION

1. Field of the Invention

The present invention relates to a semiconductor device, and more particularly, it relates to a semiconductor device monolithically implementing a high-speed and high-frequency three-terminal switching device by connecting a bipolar power transistor and a power MOS-FET (metal-oxide semiconductor field-effect transistor) in parallel with each other.

2. Description of the Prior Art

Bi-MOS devices (combinations of bipolar power transistors and power MOS-FETs) of various circuit configurations are generally employed as high-speed and high-frequency switching devices. Description is now made of some of the circuit configurations of the conventional Bi-MOS devices.

FIG. 1 shows a circuit configuration of a conventional switching device which consists of a Darlington-connected Bi-MOS device. With reference to FIG. 1, the circuit configuration of the conventional device is now described.

An n-channel power MOS-FET 2 and an npn bipolar power transistor 3 are Darlington-connected with each other. Namely, the drain of the MOS-FET 2 is connected with the collector of the bipolar transistor 3 while the source of the MOS-FET 2 is connected with the base of the bipolar transistor 3. A shunt resistor 4 is interposed between the base and the emitter of the bipolar transistor 3 while a freewheeling diode 5 is provided between the emitter and the collector of the bipolar transistor 3 in an electrically forward direction in view of the emitter. A driver 1 supplies switching signals between the gate of the MOS-FET 2 and the emitter of the bipolar transistor 3. The driver 1 also supplies the signals between the gate of the MOS-FET 2 and one end of the shunt resistor 4.

FIG. 2 is a sectional view of the Bi-MOS device as shown in FIG. 1.

Referring to FIG. 2, the n-channel MOS-FET 2 is formed of an n+-type semiconductor substrate 11 having relatively high-concentrated n-type impurities, an n−-type epitaxial semiconductor layer 12 formed on the n+-type semiconductor substrate 11 and having relatively low-concentrated impurities, a p-type impurity-diffused region 13b formed in a predetermined region on the n−-type layer 12, an n+-type impurity-diffused region 14b formed in the p-type region 13b and a gate electrode 17 formed in a predetermined region on the n−-type layer 12. An electrode interconnection 18b is provided commonly for the p-type region 13b and the n+-type region 14b. The n+-type substrate 11 is provided on its surface with a conductive film 10 which, in turn, serves as an electrode.

The n+-type region 14b serves as a source region, while the n−-type layer 12 and the n+-type substrate 11 serve as drains. An inversion layer (channel) is formed in a region of the p-type region 13b under the gate electrode 17.

The npn bipolar transistor 3 consists of a collector region formed of the n+-type substrate 11 and the n−-type layer 12, a base region consisting of a p island region 13a formed in a prescribed region on the n−-type layer 12 and an emitter region consisting of an n+-type region 14a formed in the p island region 13a. As obvious from FIG. 2, the drain region of the MOS-FET 2 and the collector region of the bipolar transistor 3 share the n−-type layer 12 and the n+-type substrate 11.

Operation of the conventional device is now described with reference to FIGS. 1 and 2.

In turn-on operation, the driver 1 supplies a pulse of positive voltage (voltage in view of the gate of the MOS-FET 2; this also applies to the following description) between the gate 17 and the source 14b of the MOS-FET 2. When the positive voltage pulse exceeds threshold voltage between the gate and the source of the MOS-FET 2, the MOS-FET 2 is turned on whereby a current flows between the drain 11, 12 and the source 14b through the channel formed in the p-type region 13b. The current serves as the forward base current to the bipolar transistor 3 to cause saturation between the base and the emitter, whereby the bipolar transistor 3 is turned on.

In turn-off operation, the driver 1 supplies a negative voltage pulse (voltage in view of the gate of the MOS-FET 2; this also applies to the following description) between the gate and the source of the MOS-FET 2, whereby the MOS-FET 2 is turned off. In response to this, a reverse bias base current to the bipolar transistor 3 flows through the collector 11, 12, the base 13a and the shunt resistor 4, whereby the bipolar transistor 3 is turned off. The switching operation has been performed in the aforementioned manner.

In the above described three-terminal monolithic Darlington-connected Bi-MOS device, however, the MOS-FET 2 and the bipolar transistor 3 are in Darlington operation and hence effects of bipolar operation are remarkable, whereby the following problems are caused:

(a) The switching speed of the bipolar transistor 3 is only slightly higher than that of an ordinary bipolar transistor, resulting from the storage time thereof.

(b) The reverse bias safe operating area is substantially similar to that of the ordinary bipolar transistor.

(c) Secondary breakdown with respect to the area of safety operation is substantially identical to that of the ordinary bipolar transistor.

(d) The shunt resistor 4 is provided in order to flow the reverse bias current for turning off the bipolar transistor 3, and hence the base current at the time of turning-on is bypassed through the shunt resistor 4.

(e) In the monolithic configuration, reduction of the chip size is restricted since the MOS-FET and the bipolar transistor are formed in different regions on the same substrate as shown in FIG. 2.

FIG. 3 shows the circuit configuration of a conventional four-terminal cascode-connected Bi-MOS device for high-speed switching operation, which is formed in a hybrid manner. With reference to FIG. 3, description is now made on the circuit configuration and operation.

An n-channel MOS-FET 2 and an npn bipolar power transistor 3 are cascode-connected with each other. Namely, the drain of the MOS-FET 2 is connected with the emitter of the bipolar power transistor 3, while the source of the MOS-FET 2 is connected with the collector of the bipolar power transistor 3 through a freewheeling diode 5. Further, the source of the MOS-FET 2 is connected with the base of the bipolar power transistor 3 through a DC (direct current) voltage source 6. A driver 1 supplies switching signals between the gate and the source of the MOS-FET 2. The freewheeling diode 5 is electrically forwardly connected in view of the source of the MOS-FET 2. The DC voltage source 6 is so connected as to apply forward bias voltage between the base and the emitter of the bipolar transistor 3 and supply a necessary base current. Description is now made of operation of the device.

In turn-on operation, the driver 1 supplies a positive voltage pulse between the gate and the source of the MOS-FET 2. When the applied pulse voltage exceeds threshold voltage between the gate and the source of the MOS-FET 2, the MOS-FET 2 is turned on. In response to this, a current flows out from the DC voltage source 6 as a base current to the bipolar transistor 3, then flows between the base and the emitter of the bipolar transistor 3, and further flows between the drain and the source of the MOS-FET 2, whereby the bipolar transistor 3 is turned on.

In turn-off operation, the driver 1 supplies a negative voltage pulse to the gate of the MOS-FET 2, whereby the MOS-FET 2 is turned off. As a result, the output path of the emitter of the bipolar transistor 3 is cut off whereby the bipolar transistor 3 is turned off.

The three-terminal cascode-connected Bi-MOS switching device in the aforementioned structure has the following disadvantages:

(a) The voltage source is provided for applying forward bias voltage between the base and the emitter of the bipolar transistor 3 whereby the driver 1 and the voltage source 6 are both required as driving circuits, and hence the device is increased in size in comparison with an ordinary device. Further, the base current flows through the voltage source 6, whereby power loss is increased in driving the device.

(b) Voltage drops are caused in both of the MOS-FET 2 and the bipolar transistor 3, whereby the power loss in an ON state is increased in comparison with ordinary bipolar transistor and MOS-FET.

(c) It is considerably difficult to form the device in monolithic structure.

(d) The external size of the entire device is increased in a hybrid combination.

FIG. 4 shows the circuit configuration of a conventional four-terminal parallel-connected Bi-MOS device for high-speed switching in hybrid structure. With reference to FIG. 4, description is now made of the circuit configuration and operation of the four-terminal parallel Bi-MOS device.

An n-channel MOS-FET 2 and a bipolar power transistor 3 are connected in parallel with each other. Namely, the drain of the MOS-FET 2 is connected with the collector of the bipolar transistor 3, and the source of the MOS-FET 2 is connected with the emitter of the bipolar transistor 3. A freewheeling diode 5 is connected between the emitter and the collector of the bipolar transistor 3 (between the source and the drain of the MOS-FET 2) in an electrically forward direction in view of the emitter (source). A driver 1 supplies signals for switching operation between the gate and the source of the MOS-FET 2, while a base driving current source 7 supplies signals for driving the bipolar transistor 3 between the base and the emitter of the bipolar transistor 3. The operation of this device is now described.

The driver 1 supplies a positive voltage pulse to the gate of the MOS-FET 2, which in turn enters an ON state. In synchronization with the positive voltage signal from the driver 1, the base driving current source 7 supplies a current pulse to the base of the bipolar transistor 3. The bipolar transistor 3 enters an ON state in response to the current pulse, whereby the MOS-FET 2 and the bipolar transistor 3 perform parallel switching operation. However, the switching speed of the MOS-FET 2 is higher than that of the bipolar transistor 3, and hence a load current flowing from a C/D terminal (junction between the drain of the MOS-FET 2 and the collector of the bipolar transistor 3) is first bypassed by the MOS-FET 2, to flow out from an E/S terminal (junction between the source of the MOS-FET 2 and the emitter of the bipolar transistor 3). Then the bipolar transistor 3 is turned on responsive to saturation between the base and the emitter, whereby the current flowing from the C/D terminal to the E/S terminal is divided according to the ratio of the voltage drop between the collector and the emitter of the bipolar transistor 3 to that between the drain and the source of the MOS-FET 2.

In turn-off operation, the driver 1 supplies any positive voltage to the gate of the MOS-FET 2, while a negative current pulse is synchronously supplied to the base of the bipolar transistor 3. The current flowing between the collector and the base of the bipolar transistor 3 is extremely small in an ON state (because of non-saturation between the collector and the base), whereby the storage time is short and the device enters an OFF state at a high speed.

The four-terminal parallel-connected Bi-MOS device in the aforementioned discrete structure has the following disadvantages:

(a) The device requires two driving circuits, i.e., the driver 1 for driving the MOS-FET 2 and the base driving current source 7 for driving the bipolar transistor 3, whereby the driving circuit formed of the two driving circuits is increased in scale.

(b) It is necessary to supply the base current from the base driving current source 7 to the bipolar transistor 3, whereby electric power loss is increased in driving.

(c) It is considerably difficult to design the MOS-FET 2 and the bipolar transistor 3 to be synchronized in switching operation.

(d) Since the MOS-FET 2 and the bipolar transistor 3 are separately driven by the two driving circuits, a dV/dt phenomenon may be caused when they are not synchronized in switching operation.

(e) The device is in hybrid structure, whereby the external size thereof is increased.

FIG. 5 shows the circuit configuration of a conventional four-terminal synthesis Bi-MOS device for high-speed switching. With reference to FIG. 5, description is now made of the circuit configuration and the structure of the circuit.

In the circuit as shown in FIG. 5, an n-channel power MOS-FET 2 is Darlington-connected with a bipolar power transistor 3, while the bipolar transistor 3 is cascode-connected with a MOS-FET 9. Namely, the drain of the MOS-FET 2 is connected with the collector of the bipolar transistor 3, and the source thereof is connected to the base of the bipolar transistor 3. The emitter of the bipolar transistor 3 is connected with the drain of the MOS-FET 9, while the collector thereof is connected with the source of the MOS-FET 9 through a freewheeling diode 5. The freewheeling diode 5 is connected in an electrically forward direction in view of the source of the MOS-FET 9. A zener diode 8 is interposed between junction $S_1$ of the source of the MOS-FET 2 and the base of the bipolar transistor 3 and the source of the MOS-FET 9 in an electrically reverse direction in view of the terminal $S_1$. A driver 1 supplies switching signals to both of the gates of the MOS-FETs 2 and 9. Description is now made of operation of the illustrated circuit.

In turn-on operation, the driver 1 supplies a positive voltage pulse between the respective gates and sources of the MOS-FETs 2 and 9. In response to this, the MOS-FETs 2 and 9 are both turned on. A current flowing between the drain and the source of the MOS-FET 2 flows as a forward bias base current to the bipolar transistor 3 through the junction $S_1$, whereby the bipolar transistor 3 is turned on. Breakdown voltage of the zener diode 8 is set to be larger than the total sum of saturation voltage between the base and the emitter of the bipolar transistor 3 and the voltage drop between the drain and the source of the MOS-FET 9, so that all of the base currents do not flow through the zener diode 8.

In turn-off operation, the driver 1 supplies a negative voltage pulse to the gates of the MOS-FETs 2 and 9. In response to this, the MOS-FETs 2 and 9 enter OFF states, whereby the output path of the emitter of the bipolar transistor 3 is cut off. In response to this, the collector current of the bipolar transistor 3 flows as a reverse bias current through the collector and the base to be bypassed through the zener diode 8, whereby the bipolar transistor 3 is turned off.

The synthesis Bi-MOS device in the aforementioned discrete structure has the following disadvantages:

(a) After the MOS-FET 9 is turned off and the emitter of the bipolar transistor 3 is cut off, the reverse bias current flows by way of the collector, the base and the zener diode 8 resulting from the stored charges in the bipolar transistor 3, whereby the reverse bias safe operating area is narrowed.

(b) The collector current flowing through the bipolar transistor 3 is bypassed through the zener diode 8 during the storage time in turn-off operation, and hence electric power loss is increased with increase in zener voltage of the zener diode 8.

With a conventional synthesis Bi-MOS device, the zener voltage of the zener diode 8 is set to be larger than the total voltage of the saturation voltage between the base and the emitter of the bipolar transistor 3 and the voltage drop between the drain and the source of the MOS-FET 9 so that the base current can not be bypassed through the zener diode 8 in turn-on operation. Thus, inevitably is the electric power loss is increased in the zener diode 8 during the storage time in turn-off operation.

(c) The feedback capacitance (capacitance between a gate and a drain) of the MOS-FETs 2 and 9 and the inductance of this circuit form an oscillation circuit, which may oscillate in turn-on operation to break the device.

(d) Electric power loss in the ON state of the device is increased by the total of the voltage drop across the MOS-FET 9 by ON resistance thereof and the saturation voltage drop across the bipolar transistor 3.

(e) MOS-FETs 2 and 9 and the bipolar transistor 3, are all required whereby the chip size is increased.

Further, this device is in the largest size within Bi-MOS devices in hybrid combinations.

Three types of Bi-MOS transistors (cascade, cascode and parallel combinations) are disclosed in "A Comparison Between Bi-MOS Device Types", M. S. Adler, IEEE Power Electronics Specialists Conference, June 1982, pp. 371-377.

SUMMARY OF THE INVENTION

Accordingly, an object of the present invention is to overcome the aforementioned disadvantages of the prior art and provide a three-terminal Bi-MOS device of high efficiency which can be provided in monolithic structure of small size and is applicable to an inverter or chopper device capable of high-frequency operation at a frequency over 100 KHz.

A Bi-MOS semiconductor device according to the present invention is arranged in such structure that, in a bipolar transistor having a collector layer on a semiconductor substrate, a base layer formed on the collector layer and an emitter island formed in the base layer region, at least one groove is formed to reach at least the interface between the base layer and the collector layer from the surface of the bipolar transistor in the interior or peripheral region of the emitter island, so as to be employed as a gate electrode of a MOS-FET.

Further, in order to form a three-terminal switching circuit, the electrode formed at the groove is connected with a base electrode of the bipolar transistor through diodes. The diodes consist of a constant-voltage diode and high-speed diodes which are connected in parallel with the constant-voltage diode.

With the aforementioned structure, the present invention has the following advantages:

(1) The emitter island serves both as the emitter of the bipolar transistor and the source of the MOS-FET while the collector layer of the bipolar transistor functions as the drain of the MOS-FET, whereby the MOS-FET and the bipolar transistor are connected in parallel with each other, to be applicable to a high-current-/high-voltage device.

(2) The MOS-FET and the bipolar transistor are monolithically formed in the same region, and hence the chip size is substantially similar to a bipolar transistor of a similar current/voltage rating.

(3) The clamper of the constant-voltage diode and the high-speed diodes is employed between the gate of the MOS-FET and the base of the bipolar transistor, whereby the device can be driven by one small driving circuit.

(4) The bipolar transistor performs operation in a quasi-saturated or active region by the constant-voltage diode provided between the gate and the base, whereby stored charges are reduced and the reverse bias base current of the bipolar transistor is extremely reduced, which results that a reverse bias safe operating area is increased.

(5) The MOS-FET and the bipolar transistor are connected in parallel with each other, and further the bipolar transistor is made to operate in the quasi-saturated or active region, whereby high-speed switching operation is enabled.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 6:
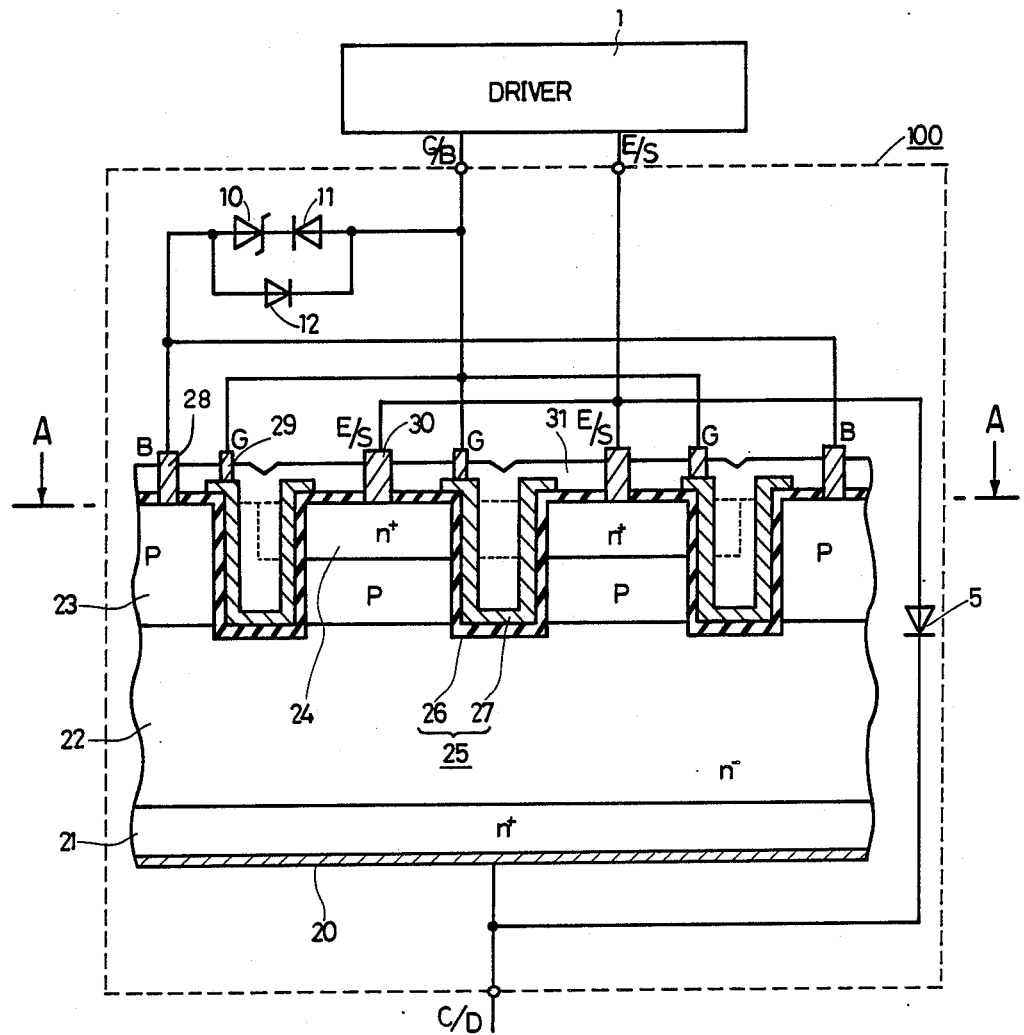
FIG. 6 is a diagram showing sectional structure and interconnection with an external circuit of a monolithic Bi-MOS switching device according to an embodiment of the present invention.
Figure 7:
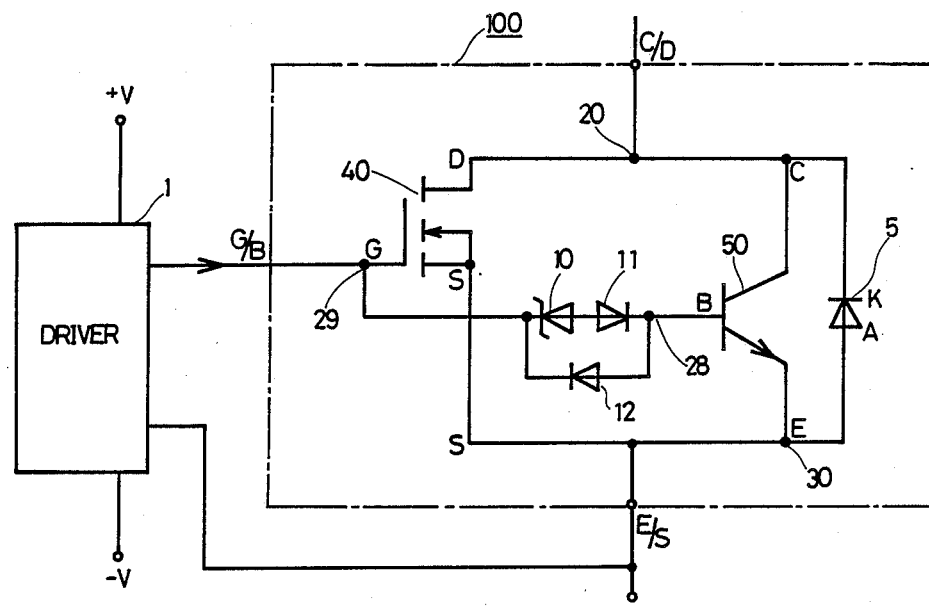
FIG. 7 is a diagram showing an equivalent circuit configuration of the monolithic three-terminal Bi-MOS switching device as shown in FIG. 6.

Description is now made on an embodiment of the present invention with reference to FIGS. 6 and 7.

FIG. 6 shows sectional structure and connection with an external circuit of a semiconductor device monolithically formed of a MOS-FET and a bipolar transistor according to the present invention. The semiconductor device is cut along the periphery of an emitter island in FIG. 6. The structure of the Bi-MOS semiconductor device is now described.

A collector layer consisting of an $n^+$-type layer 21, an $n^-$-type layer 22 formed on the $n^+$-type layer 21, a p-type base layer 23 formed on the $n^-$-type layer 22 and a plurality of emitter islands ($n^+$-type layers) 24 (only one being shown in FIG. 6) are prepared as start material through conventional manufacturing steps. The present invention is characterized in that a plurality of grooves, preferably in the form of square pillars, are formed in the peripheral regions of the emitter islands 24 at a constant pitch using a reactive ion beam etching process. The grooves 25 are so formed that the bottom surfaces thereof reach at least the interface between the p-type layer 23 and the $n^-$-type layer 22. Exposed surfaces of the grooves 25, the $n^+$-type layer 24 and the p-type layer 23 are covered by with oxide film 26. A polysilicon layer 27, serving as an electrode, is formed on the oxide film 26 on the grooves 25. Further, a base electrode 28, a gate electrode 29 and an emitter/source electrode 30 are provided in predetermined regions on the polysilicon layer 27. A passivation film 31 for protecting the surface of the device is formed by, e.g., phosphor glass (PSG) on the surface except for the electrodes 28, 29 and 30. A conductive film 20 is formed on the surface of the $n^+$-type layer 21 opposite to the $n^-$-type layer 22, to serve as a collector/drain electrode.

In the aforementioned structure, the $n^+$-type layer 24 serves as both of the emitter of the bipolar transistor and the source of the MOS-FET, and the $n^+$-type layer 21 and the $n^-$-type layer 22 serve both as the collector of the bipolar transistor and the drain of the MOS-FET. Thus, implemented is such structure that the MOS-FET and the bipolar transistor are connected in parallel without interconnection. The grooves 25 serve as the gate region of the MOS-FET.

Figure 8:
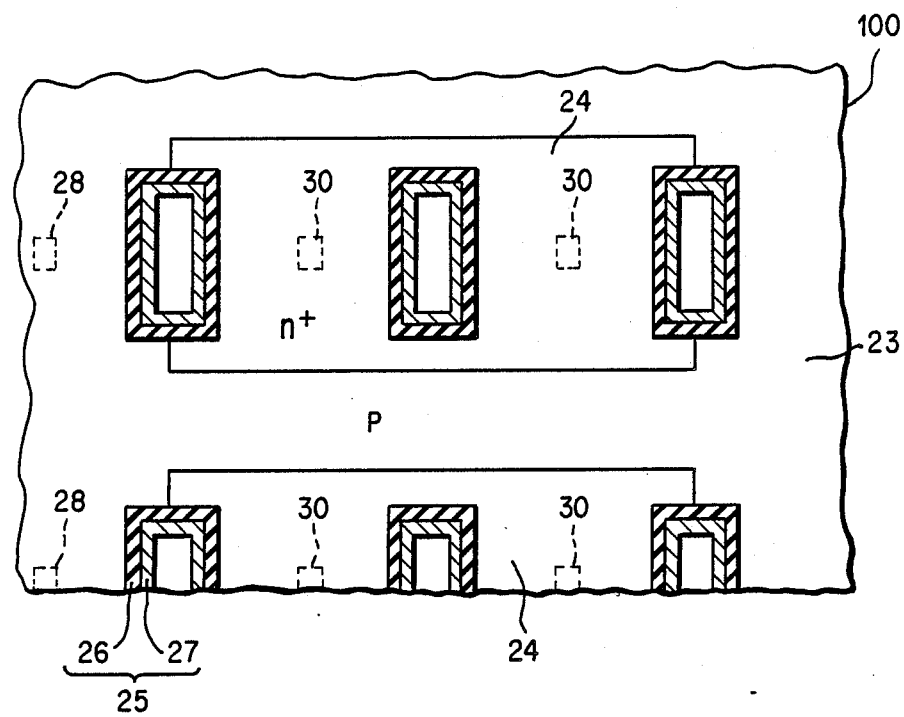
FIG. 8 is a plan view taken at section line A—A of FIG. 6 showing connection of the electrodes to surface positions of the semiconductor layers therein.

As seen in FIG. 6, the base electrodes 28 penetrate oxide film 26 to contact the upper surface of the p-type base layer, while the common emitter-source terminals 30 similarly penetrate oxide layer 26 to contact the upper surface of the emitter island formed at layer 24. A partial plan view is shown at FIG. 8, taken along section line A—A of FIG. 6, showing the above described connections of the terminals.

Further, a freewheeling diode 5 is provided between the conductive layer (collector/drain electrode) 20 and the emitter/source electrode 30 in an electrically reverse direction in view of the collector/drain electrode 20 as an external circuit for the semiconductor device to be employed as a switching device. Between the base electrode 28 and the gate electrode 29, a constant-voltage diode (zener diode) 10 is connected in an electrically forward direction in view of the base electrode 28 and a high-speed switching diode 11 in an electrically reverse direction in view of the base electrode 28 in series with each other, while a high-speed diode 12 is connected in a forward direction in view of the base electrode 28 in parallel with the diodes 10 and 11.

Figure 1:
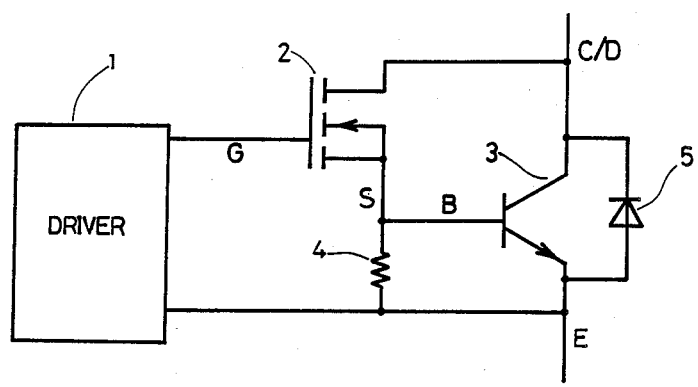
FIG. 1 is a circuit diagram showing a switching device employing a conventional Darlington(cascade)-connected Bi-MOS device.
Figure 2:
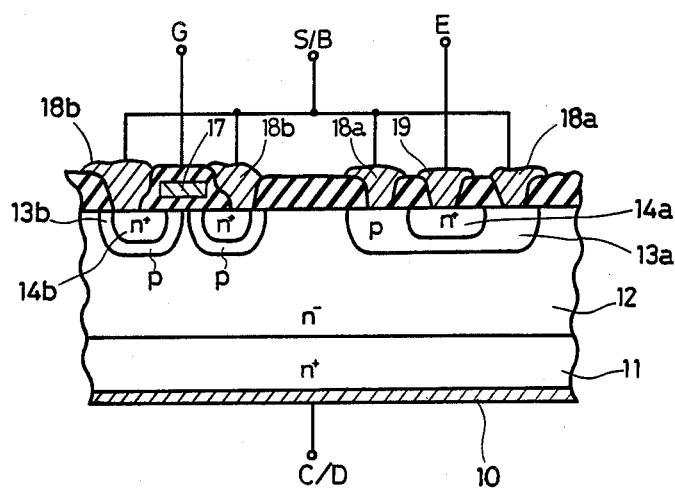
FIG. 2 is a sectional view of the Darlington-connected Bi-MOS device as shown in FIG. 1 in monolithic structure.
Figure 3:
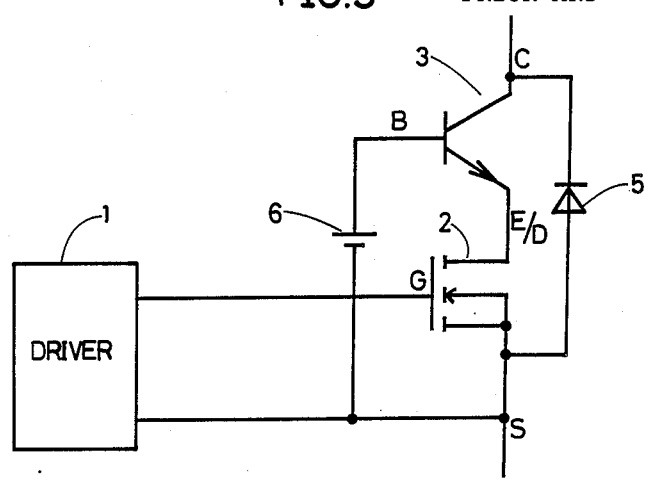
FIG. 3 is a circuit diagram showing a switching device employing a conventional Bi-MOS device of a cascode combination.
Figure 4:
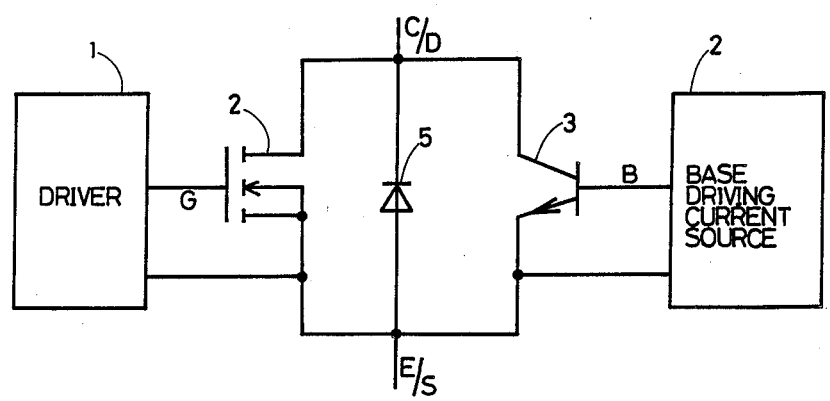
FIG. 4 is a circuit diagram showing a conventional four-terminal parallel Bi-MOS switching device.
Figure 5:
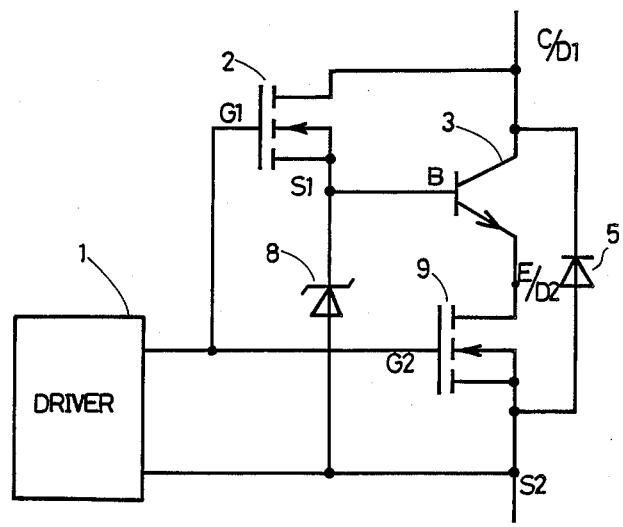
FIG. 5 is a circuit diagram showing a conventional synthesis Bi-MOS switching device.

As obvious from comparison of FIGS. 2 and 6, the MOS-FET and the bipolar transistor are formed in the same region according to the present embodiment, whereby the chip size can be remarkably reduced as compared with the conventional devices.

FIG. 7 shows an equivalent circuit of the semiconductor device shown in FIG. 6. Referring to FIG. 7, a MOS-FET 40 is connected in parallel with a bipolar transistor 50. A driver 1 supplies driving pulses between a gate electrode 29 and an emitter/source electrode 30. Symbol C/D denotes junction between the drain of the MOS-FET 40 and the collector of the bipolar transistor 50, and symbol E/S denotes a connecting terminal between the source of the MOS-FET 40 and the emitter of the bipolar transistor 50. With reference to FIGS. 6 and 7, description is now made on the operation of the semiconductor device and the switching circuit according to the present invention.

In turn-on operation, when the level of a pulse voltage supplied from the driver 1 between the gate electrode 29 of the MOS-FET 40 and the emitter/source electrode 30 exceeds threshold voltage level of the MOS-FET 40, a p-type base layer 23 around grooves 25 forming the gate region of the MOS-FET 40 is inverted to an n-type layer to form a channel of the MOS-FET 40, whereby the MOS-FET 40 is turned on. The voltage drop between the C/D and E/S terminals is determined by the ON resistance and the drain current of the MOS-FET 40. When the level of input pulse voltage from the driver 1 exceeds the total voltage (hereinafter referred to as gate-to-base voltage drop $V_{GB}$) of zener breakdown voltage of the zener diode 10, the forward voltage drop of the high-speed switching diode 11 and the forward voltage drop between the base and the emitter of the bipolar transistor 50, the input pulse voltage from the driver 1 is changed to a base current through the zener diode 10 and the high-speed switching diode 11, to be supplied to the base of the bipolar transistor 50. In the interior of the bipolar transistor 50, the base current substantially flows between the p-type base layer 23 and the $n^+$-type emitter layer 24, whereby between the base and the emitter saturation results and the bipolar transistor 50 is turned on in bipolar operation. The MOS-FET 40 is already turned on and the voltage between the C/D and E/S terminals is low at this time, and hence the base current flowing between the base and the collector of the bipolar transistor 50 is extremely smaller than that in ordinary case or no current flows therebetween as the case may be. Therefore, the bipolar transistor 50 performs a switching operation in a quasi-saturated or active region to result in a high-speed switching operation. At this time, it is sufficiently possible to make the storage time of the bipolar transistor 40 less than serveral tens nsec. As a condition required for the aforementioned turn-on mechanism, the gate-to-base voltage drop $V_{GB}$ must be higher than the threshold voltage between the gate and the source of the MOS-FET 2. In other words, the MOS-FET 40 must be turned on in advance to the bipolar transistor 50.

In turn-off operation, the driver 1 applies a negative voltage pulse between a G/B terminal (junction between the gate of the MOS-FET 40 and the base of the bipolar transistor 50) and the E/S terminal, whereby both of the MOS-FET 40 and the bipolar transistor 50 are turned off. Since the bipolar transistor 50 operates in the quasi-saturated or active region at this time, the storage time is extremely short with substantially no flowing of a reverse bias current, which generally flows through a bipolar transistor in a turn-off operation. Therefore, a reverse bias safe operating area is wider than that of a conventional bipolar transistor.

Although the grooves 25 forming the gate region are formed in peripheral regions of emitter islands in the aforementioned embodiment, the same may be formed in inner regions of the emitter islands to obtain a similar effect.

Further, although the bipolar transistor is of an npn type and the MOS-FET is formed as an n-channel MOS-FET, conductive types thereof are not restricted to the described examples.

In addition, connection of the diodes of the external circuit may be in other connecting structure so far as an effect similar to that of the aforementioned embodiment is obtained.

According to the present invention as hereinabove described, the grooves are formed in the emitter island region of the bipolar transistor to serve as a gate region of a MOSFET, whereby the MOS-FET and the bipolar transistor can be monolithically fabricated in a chip of small size. Further, the MOS-FET and the bipolar transistor are connected in parallel with each other in monolithic structure while the gate of the MOS-FET is connected with the bipolar transistor through the diodes, and hence a switching device is obtained which is small in size and capable of high-speed operation. Therefore, when the present invention is applied as, e.g., a switching device of 100A/1000V rating to an inverter or chopper device, it is possible to implement an inverter or chopper device which can perform high-frequency operation at a frequency over 100 KHz.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a MOSFET and a bipolar transistor, including:
   a semiconductor substrate (21, 22) of a first conductivity type having a first surface, said substrate forming a collector of said bipolar transistor and a drain of said MOSFET;
   a first semiconductor layer (23) of a second conductivity type formed on an opposing surface of said semiconductor substrate (21, 22) opposing said first surface and forming a base of said bipolar transistor;
   a second semiconductor layer (24) of said first conductivity type provided as an island extending from an exposed surface of said first semiconductor layer (23) toward said first surface and smaller in thickness than said first semiconductor layer (23), said second layer forming both an emitter of said bipolar transistor and a source of said MOSFET; and
   at least one groove (25) formed in a region of said second semiconductor layer (24), said groove (25) being formed to reach at least an interface between said semiconductor substrate (22) and said first semiconductor layer (23), a gate electrode of said MOSFET comprising a conductive material (27) on a surface of the groove and separated from said surface of said groove by a dielectric film (26)
   wherein a conductive film (20) is formed on said first surface of said semiconductor substrate (21, 22), and a region adjacent said groove (25) comprises a gate region thereby to form, together with said drain and said source, said metal-oxide-semiconductor field-effect transistor (MOSFET);
   wherein said first semiconductor layer (23) and said conductive material (27) of said groove region (25) are connected through a series element including a first diode (11) connected in an electrically forward direction with respect to said conductive material (27) of said groove region (25), said first diode connected in series with a constant-voltage diode (10) in an electrically reverse direction thereto, said series element including a second diode (12) connected in parallel with said first diode and said constant voltage diode in an electrically reverse direction relative to said conductive material (27) of said groove region (25), and further including an additional diode (5) connected between said second semiconductor layer (24) and said semiconductor substrate (21, 22) in an electrically forward direction relative to said second semiconductor layer (24) thereby to form a high-voltage/high-current switching device capable of high-speed operation.

2. A semiconductor device in accordance with claim 1, wherein said groove (25) is formed in a boundary region between said first semiconductor layer (23) and a side surface of said second semiconductor layer (24).

3. A semiconductor device comprising:
   a semiconductor substrate (21, 22) of a first conductivity type having a first surface;
   a first semiconductor layer (23) of a second conductivity type formed on a surface of said semiconductor substrate (21, 22) opposing said first surface;
   a second semiconductor layer (24) of said first conductivity type provided in the form of an island extending from an exposed surface of said first semiconductor layer (23) toward said first surface and smaller in thickness than said first semiconductor layer (23); and
   at least one groove (25) formed in a region of said second semiconductor layer (24), said groove (25) being formed to reach at least an interface between said semiconductor substrate (22) and said first semiconductor layer (23), conductive material (27) being formed on a surface of said groove and separated therefrom by a dielectric film (26),
   wherein a conductive film (20) is formed on said first surface of said semiconductor substrate (21, 22), said semiconductor substrate (21, 22) serves as a collector region, said first semiconductor layer (23) serves as a base region and said second semiconductor layer (24) serves as an emitter region thereby to form a bipolar transistor, and said second semiconductor layer (24) serves as a source region, said semiconductor substrate (21, 22) under said second semiconductor layer (24) serves as a drain region and a region adjacent said groove (25) serves as a gate region thereby to form a metal-oxide-semiconductor field-effect transistor;

wherein said first semiconductor layer (23) and said conductive material (27) of said region adjacent said groove (25) are connected through a series body in which a diode (11) in an electrically forward direction in view of said conductive material (27) of said groove region (25) is connected in series with a constant-voltage diode (10) in an electrically opposite direction thereto and a diode (12) connected in parallel with said series body in an electrically reverse direction in view of said conductive material (27) of said groove region (25) while a diode (5) is connected between said second semiconductor layer (24) and said semiconductor substrate (21, 22) in an electrically forward direction in view of said second semiconductor layer (24) thereby to form a high-voltage/high-current switching device capable of high-speed operation.

4. A single semiconductor device as recited in claim 1, the device comprising a plurality of vertical grooves, a first set of said grooves separating said common emitter and source formed in said island from a surface portion of said base region, and a second set of said grooves located within said island to define said gate region of said MOSFET.

5. A semiconductor device in accordance with claim 1, further comprising a structural arrangement for separating terminals for an emitter/source electrode, a gate electrode, and a base electrode, on the one hand, and a vertical junction between said island and said first semiconductor layer (23), on the other hand, thereby reducing charge storage of junctions formed in said MOSFET and said bipolar transistor and enabling operation of the device with common terminals for said source and emitter and for said drain and collector.

6. A semiconductor device in accordance with claim 5, wherein said structural arrangement for separating comprises said groove positioned for separating said island from said base of said bipolar transistor together with said diodes of said series element, permitting operation of said device in a non-saturated state.

7. A semiconductor device in accordance with claim 6, wherein said MOSFET and bipolar transistor are formed in an integrated circuit chip, thereby to provide a single three-terminal device of reduced size and enhanced speed of operation.

8. A semiconductor device as recited in claim 1, wherein said conductivity type of said substrate, said conductivity type of said first layer and said conductivity type of said second layer provide an enhancement mode of operation for said bipolar transistor and said MOSFET, thereby turning on said bipolar transistor when a high-level signal is applied to a base terminal connected to said base thereof and turning on said MOSFET when a high-level signal is applied to a gate terminal connected to said gate thereof.

* * * * *